United States Patent [19]
Kawamura

[11] Patent Number: 5,328,558
[45] Date of Patent: Jul. 12, 1994

[54] METHOD FOR ETCHING AN $SiO_2$ FILM

[75] Inventor: Kouhei Kawamura, Yamanashi, Japan

[73] Assignees: Tokyo Electron Limited, Tokyo; Yasuhiro Horiike, Hiroshima, both of Japan

[21] Appl. No.: 36,846

[22] Filed: Mar. 25, 1993

[30] Foreign Application Priority Data

Mar. 25, 1992 [JP] Japan .................. 4-98895

[51] Int. Cl.[5] ......................... H01L 21/306
[52] U.S. Cl. .................. 156/643; 156/653; 437/228; 437/946; 148/DIG. 17
[58] Field of Search ............... 156/643, 653; 437/228, 437/946; 748/DIG. 17

[56] References Cited

U.S. PATENT DOCUMENTS

| | | | |
|---|---|---|---|
| 4,711,698 | 12/1987 | Douglas | 156/643 |
| 4,807,016 | 2/1989 | Douglas | 156/653 |
| 4,985,372 | 1/1991 | Narita | 437/192 |
| 5,100,504 | 3/1992 | Kawai et al. | 156/643 |
| 5,236,868 | 8/1993 | Nulman | 437/190 |

Primary Examiner—T. N. Quach
Attorney, Agent, or Firm—Oblon, Spivak, McClelland, Maier & Neustadt

[57] ABSTRACT

An $NF_3/H_2$ mixture as a feed gas for an etchant for etching an $SiO_2$ film on an silicon wafer is used with a 1 : 160 $NF_3/H_2$ mixed ratio. The mixture is made into plasma, and activated species of fluorine, hydrogen and nitrogen are supplied downstream to allow the species to be adsorbed in and on the $SiO_2$ film. The $NF_3/H_2$ mixed ratio of the mixture is so set as not to effect the etching of the $SiO_2$ film under a chemical action. Then the adsorbed activated species are irradiated with Ar low energy ions so that the activated species are excited and etch the $SiO_2$ film. During etching, the semiconductor wafer is maintained to about $-100°$ C. Less damage is caused to the silicon wafer and etching can be made in a high selection ratio.

11 Claims, 3 Drawing Sheets

METHOD FOR ETCHING AN SIO2 FILM

Background of the Invention

1. Field of the Invention

The present invention relates to a dry etching method for etching an $SiO_2$ film with the use of a gas.

2. Description of the Related Art

Upon exposure with water or oxygen, silicon (Si) is converted to silicon dioxide ($SiO_2$) through their reaction. A $SiO_2$ film is liable to be produced on the surface of an Si wafer through natural oxidation. It is normally not desirable to involve such natural oxidation. In the epitaxial growth, for example, the formation of a natural oxidation film exerts a bad effect on the quantity of a grown layer. In the process for manufacturing a dynamic random access memory beginning with the so-called "256M-bit memory" generation, the natural oxidation film exerts an adverse effect on the formation of a gate oxide film or interconnection contact.

At the present time, the most effective method for eliminating a natural oxidation film is to perform wet etching by a buffer hydrofluoric (BHF) acid. The wet etching method allows etching to be performed with a high ratio of selection. With the application of the etching method to a device of a high aspect ratio structure, however, a solution is hard to penetrate into grooves (trenches) and holes so that the removal of the natural oxidation film is incomplete. Further, after etching, the solution is also hard to remove from the trench. Under these situations a demand has been made for a dry process method by which the natural oxide film is eliminated. A dry etching method, for example, has been proposed which utilizes HF vapor.

On the other hand, during the formation of contact holes or vid holes in the manufacture of a semiconductor device, an $SiO_2$ film for use as a field insulating film and insulating interlayer is etched by a fine pattern mask of a photoresist and, in this case, etching has to be positively stopped when reaching an underlying film. For this object, currently, it is necessary to employ a reactive ion etching (RIE) method, a dry etching method which uses $CF_4 + H_2$, $CHF_3 + O_2$, etc.

In drying etching methods using HF vapor, however, fluorine (F) are liable to stay on a wafer surface, after etching, at a higher concentration level than the wet etching method. The staying fluorine imparts a bad influence to a subsequent process.

In the RIE method used for $SiO_2$, in order to break an Si-O bond whose bond force is of the order of 88 Kcal/mol, it is normally necessary to give a fluorocarbon ion impact of high energy over about 500 eV. The ion impact of high energy is also given to an Si substrate, so that an Si-Si bond, whose bond force is 42 Kcal/mol and smaller than the Si-O bond, is cut. Therefore, damage is induced in a silicon wafer upon impact or upon exposure. Although a damaged layer as well as a layer contaminated with fluorocarbon is usually removed by the dry etching using fluorine atoms, various problems occur such that the silicon wafer has its surface roughened and a pn junction layer is broken. For this reason the application of the RIE method to the "next generation" device involves those impending problems to be solved. Further, in the RIE methods, an etching ratio of selection between $SiO_2$ and Si is not completely satisfactory.

SUMMARY OF THE INVENTION

It is accordingly the object of the present invention to provide a method for etching an $SiO_2$ film which can obtain a high ratio of selection and involves less damage and less contamination on and in a wafer.

In a process leading to the present invention, the inventor has found that there is a correlative relation, to wafer temperature, of the characteristics of etching by those active species which are induced under a "plasma" condition of a mixture of a first gas containing fluorine (F) and second gas containing hydrogen (H). The inventor also has found that the etching characteristics for an $SiO_2$ film and, in particular, an $SiO_2$/Si selection ratio are largely improved by cooling wafer temperature below 0° C. The same result can be obtained by introducing the second gas in crude form with only the first gas in a plasma state and vice versa, but that etching rate is somewhat lowered. Even when, in place of the plasma state involved, the gas was excited by an ArF excimer laser, the same result was also obtained, but the plasma method was the most effective.

The reason why an $SiO_2$ film on a silicon layer is not etched with an $NF_3/H_2$ mixed gas is probably because $(NH_4)_2SiF_6$ is formed on the silicon layer, that is, it serves as a protective film.

An etching method according to a first aspect of the present invention is concerned with the selective etching of an $SiO_2$ film on a silicon layer in which case an etchant contains fluorine and hydrogen activated species. The layer and film are cooled below 0° C. This etching method, being isotropic in nature, is suitable to the removal of a natural oxidation film.

An etching method according to a second aspect of the present invention is concerned with the dry anisotropic etching of an $SiO_2$ film in which case an etchant contains fluorine and hydrogen activated species. The film is cooled below 0° C. and the mixed ratio of the etchant is so set as to stop a spontaneous etching (chemical etching). The $SiO_2$ film is etched because the activated species adsorbed in and on the $SiO_2$ film are excited by low energy atomic ions of an inert gas.

An etching method according to a third aspect of the present invention is concerned with the dry anisotropic etching of an $SiO_2$ film. This method is similar to the method according to the second aspect in that the etchant used contains fluorine and hydrogen activated species. The film is cooled below 0° C. and the mixed ratio of the etchant is so set as to stop spontaneous etching (chemical etching). It is to be noted that the activated species adsorbed in and on the $SiO_2$ film are excited not by atomic ions of an inert gas but by low energy ions which are produced by converting a feed gas, which provides the etchant, to a plasma just over the $SiO_2$ film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
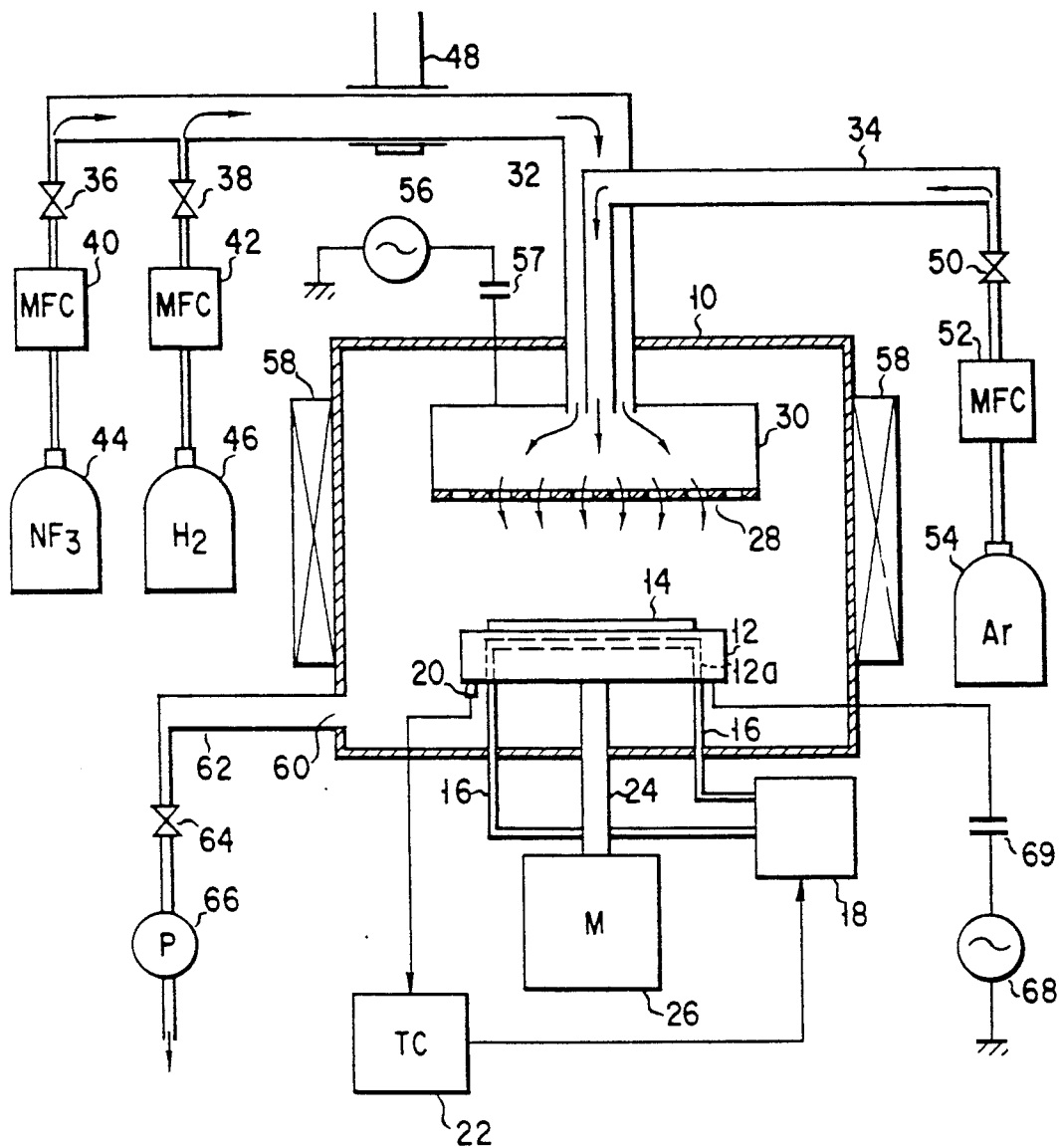
FIG. 1 is a view schematically showing an etching apparatus for use in etching methods according to the present invention.

FIG. 1 shows a view schematically showing an etching apparatus for use in etching methods according to the present invention.

In the etching apparatus, a disc-like susceptor 12 is located in a lower center zone within a vacuum chamber 10. A silicon wafer, that is, a semiconductor wafer 14, is placed on the susceptor 12 as a material to be processed. A passage 12a is provided in the susceptor 12 to allow a coolant gas to flow there. A pipe 16 is connected to the passage 12a to enable a coolant, such as liquefied nitrogen, to be supplied from a coolant medium supply device 18 into the susceptor 12 via the pipe 16. By this arrangement it is possible to cool the susceptor 12.

The temperature of the susceptor 12 and hence the wafer 14 is controlled by adjusting an amount of the coolant supplied from the coolant medium supply device 18. In order to perform temperature control, a sensor such as a thermocouple 20 is attached to the susceptor 12. In accordance with a temperature level detected by the thermocouple 20, an amount-of-flow control signal is supplied from a temperature control section 22 to the coolant medium supply device 18 so as to adjust the amount of the coolant supplied. In order that the surface of the wafer 14 may be etched uniformly, the susceptor 12 is rotationally driven by a drive motor 26 through a rotation shaft 24.

A buffer chamber 30 is provided at the upper center zone within the vacuum chamber 10 with a porous plate 28 attached to the lower surface side of the buffer chamber 30. One end of each of pipes 32 and 34 is opened into the buffer chamber 30 and these pipes are made of, for example, stainless steel. The pipe 32 introduces activated species, under a plasma excitation condition, into the chamber 10. The pipe 32 is connected to an $NF_3$ gas supply source 44 and $H_2$ gas supply source 46 respectively through switching valves 36 and 38 and mass flow controls (MFC's) 40 and 42. On a way to the pipe 32 a microwave guide 48 is connected in a capacitive-coupling fashion so as to produce a plasma.

The pipe 34 introduces Ar in a plasma phase or Ar ions in a plasma into the chamber 10. The pipe 34 is connected to an Ar gas supply source 54 through a switching valve 50 and an MFC 52. A 2.45 GHz high-frequency power source 56 for generating a plasma is connected to the buffer chamber 30 via an impedance matching box 57. A magnet coil 58 is attached to the vacuum chamber 10.

A 13.56 MHz high-frequency power source 68 is connected through an impedance matching box 69 to the susceptor 12 and is employed to make a feed gas into plasma to derive an etchant in the vacuum chamber.

An evacuation opening 60 is provided in a lower zone of the vacuum chamber 10 to create a vacuum in the chamber through evacuation. A pipe 62 connected through a switching value 64 to a vacuum pump 66 is connected to the evacuation opening 60.

The etching method according to a first embodiment of the present invention will be explained below. Here explanation will be given below with reference to, for example, removing a natural oxidation film on a silicon wafer.

First, the silicon wafer 14 is placed on the susceptor 12 within the vacuum chamber 10 and the chamber is evacuated to create a vacuum. The evacuation of the vacuum chamber 10 is carried out until etching is complete and, in this case, the chamber interior is set to below $1 \times 10^{-3}$ Torrs.

In order to use a $NF_3/H_2$ mixture as a feed gas for the etchant, the switching valves 36 and 38 are opened. Amounts of $NF_3$ and $H_2$ supplied are controlled, by MFC's 40 and 42, to 20 and 40 SCCM's, respectively, to obtain a 1 : 2 $NF_3/H_2$ mixed ratio. The mixture is fed into the pipe 32 at a total pressure of 0.2 Torrs. A 50W power microwave with a frequency of 2.45 GHz is fed by the microwave guide 48 into the pipe 32 where the mixture is made into plasma.

Activated species of fluorine $F^*$, activated species of hydrogen $H^*$ and activated species of nitrogen $N^*$ produced by the plasma are introduced down the pipe 32 into the buffer chamber 30 and the wafer 14 on the susceptor is flooded with these species via the porous plate 28.

The wafer 14 on the susceptor 12 is cooled below 0° C. by the susceptor 12 and hence by the cooling device 18. The activated species $F^*$, $H^*$ and $N^*$ are directed onto the cooled wafer 14 and adsorbed in and on the natural oxidation film on the wafer surface to effectively react with $SiO_2$. A reaction product is vaporized out of the vacuum chamber 10 past the evacuation opening 60.

Figure 2:
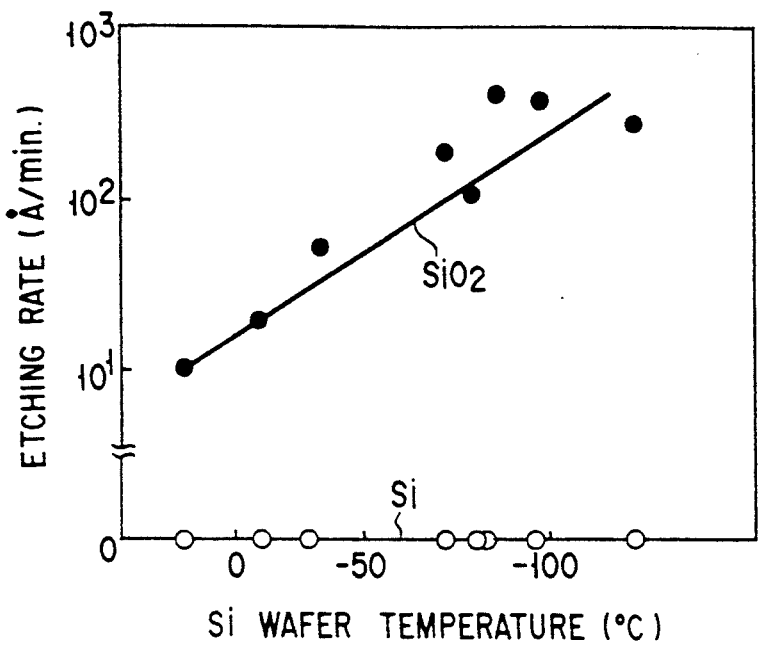
FIG. 2 is a graph showing a temperature dependency of etching rates of Si and $SiO_2$.

FIG. 2 is a graph showing the etching characteristic of an $SiO_2$ film and silicon wafer when the method of the first embodiment is carried out in the apparatus of FIG. 1 under different temperature conditions.

As will be understood from FIG. 2, the silicon wafer is not etched at any temperature below 25° C. while, on the other hand, the $SiO_2$ film is etched at an etching rate which is increased as the temperature involved is lowered. According to the test made according to the present invention, the etching rate of the $SiO_2$ film reached about 800 angstroms/minute at $-120°$ C.

That is, it is possible to obtain an infinite $SiO_2/Si$ selection ratio at a temperature below 25° C. That is purely chemical etching by the activated species $F^*$, $H^*$ and $N^*$ in contrast with physical etching accompanied with an exposure of a wafer with a high energy plasma or ions. Therefore, there is no risk that any damage will be made to the wafer. Since a treating gas ($NF_3$, $H_2$) used contains no carbon, there is no carbon contamination problem. The etching method of the first embodiment of the present invention is accompanied with isotropic etching and it is adequately suitable to the removal of a natural oxidation film.

The etching methods will be explained below in conjunction with the second and third embodiments of the present invention.

Figure 3:
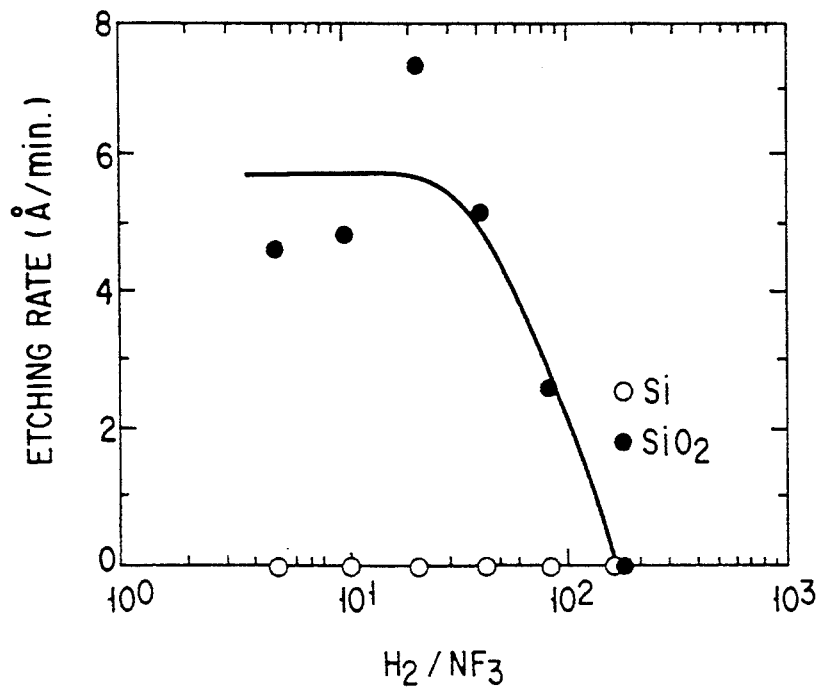
FIG. 3 is a graph showing an $H_2/NF_3$ ratio dependency of etching rates of Si and $SiO_2$.

FIG. 3 is a graph showing dependency of etching rates of an SiO$_2$ film and silicon wafer upon an H$_2$/NF$_3$ concentration ratio. Here the silicon wafer was set at about −60° C. and an H$_2$/NF$_3$ mixture was used as a feed gas for an etchant. NF$_3$ was flowed at a predetermined flow rate of 20 SCCM and at 50 mTorrs while the H$_2$/NF$_3$ mixed ratio was varied by varying the flow rate of H$_2$. The mixed gas (mixture) was made into plasma by a 50W microwave with a frequency of 2.45 GHz and, activated species F*, H* and N* derived from the plasma are supplied onto the wafer downstream.

As will be understood from FIG. 3, the etching was completely stopped at a concentration ratio of 160 for Si and for SiO$_2$. The reason why spontaneous etching of SiO$_2$ is stopped is probably because a stable layer is formed on the SiO$_2$ surface with an addition of H and further because a deposited film, probably (NF$_4$)2SiF$_6$, is formed on the stable layer and serves a protective film.

The inventor has found that, under the condition that spontaneous etching is stopped, when the silicon wafer is exposed, for a given time only, with a plasma or low energy ions (for example, atoms of inert gas Ar), only SiO$_2$ is selectively etched in place of Si being etched. When no spontaneous etching is made while supplying the activated species onto the silicon wafer, the activated species are brought to a state in which they are adsorbed in and on the surface of the SiO$_2$ film. It is considered that, upon exposure with the plasma or low energy ions, the activated species are excited to react with SiO$_2$ so that the SiO$_2$ film is etched. As shown in FIG. 2, it is possible to, by lowering the temperature involved, increase an amount of activated species adsorbed and to speed up the reaction involved. It is considered that the reason for Si being not etched is ascribed to the protective effect of the deposited film as in the case shown in FIG. 2.

In this case, the direction in which etching progresses depends upon the angle at which the plasma or low energy ions are incident. Further, during etching, the film on the wafer is deposited on the side wall of the wafer, thus preventing side etching. It is possible to perform anistropic etching at a high selection ratio. Even in the anisotropic etching according to the second and third embodiments, the activated species works on the basis of chemical reaction etching, thus causing less damage to the silicon wafer. Further the treating gas contains no carbon and hence there is no carbon contamination problem.

Figure 4A:
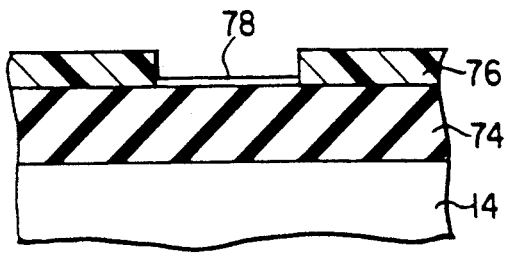
FIGS. 4A to 4C are views showing steps of a second embodiment of the present invention.
Figure 4B:
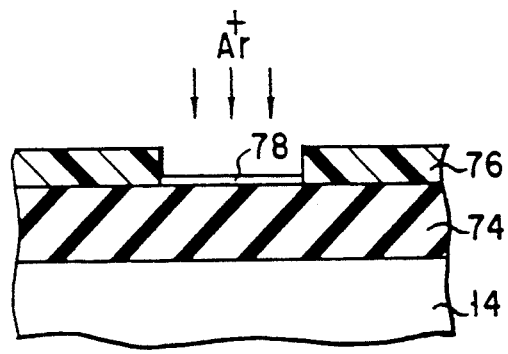
Figure 4C:
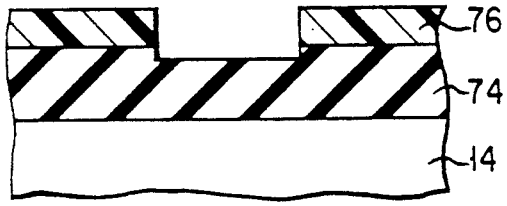

Explanation will now be made below about a pattern etching by using the etching method according to the second embodiment of the present invention. FIGS. 4A to 4C show the sequential steps of etching, each of which is indicated by a corresponding cross-section. In these Figures, 14 denotes a silicon wafer; 74, an SiO$_2$ film; 76, a resist film; and 78, a protective film formed of (NH$_4$) SiF$_6$.

Even in the second embodiment, the chamber holding a silicon wafer in place on the susceptor is evacuated to a vacuum state as in the case where the aforementioned spontaneous oxidation film is removed. Subsequently, the evacuation of the vacuum chamber 10 is carried out until the etching is complete. The chamber 10 is set to below $1 \times 10^{-3}$ Torrs inside.

As a feed gas for an etchant, a NF$_3$/H$_2$ mixture is employed as in the first embodiment and made into plasma in the pipe 32, producing activated species of fluorine F*, activated species of hydrogen H* and activated species of nitrogen N*. These species are supplied on to the wafer 14 downstream. Here the NF$_3$/H$_2$ mixed ratio is set to be 1 : 160 and a pressure is selected as being 0.2 Torrs. Further, the wafer 14 is cooled down to about −100° C. Under the situation, these activated species F*, H* and N* are brought in contact with the surface of the SiO$_2$ film 74 overlying the wafer 14 and some forms a very thin protective film 78 constituted by (NH$_4$)2SiF$_6$ and others stay adsorbed as they are (FIG. 4A). As a result, a reaction with the SiO$_2$ film is not progressed and no spontaneous etching (chemical etching) is carried out. The activated species are supplied for, e.g., one second and then the flow of the NF$_3$/H$_2$ mixture is stopped by closing valves 36 and 38.

with such spontaneous etching in a stopped or freezed state, the switching valve 50 is opened and an Ar gas is fed from the Ar gas source 54 into the pipe 34. The Ar gas is made into plasma by the high-frequency power source 56 and magnet coil 58. An inert gas plasma or Ar ions are fed into the buffer chamber 30 and, via the porous plate 28, the wafer 14 are irradiated with the plasma or Ar ions for a predetermined period of time, for example, 10 seconds (FIG. 4B). In this case, the power of the high-frequency power source 56 is so set as to suppress Ar ion energy to, for example, about 20 eV. If the Ar ion energy is too great, the Ar ions etch an object to be processed on the basis of physical action. Thus there is a risk that damage to the object will be caused to the silicon wafer.

The Ar inert gas plasma or low energy ions are directed to, from above, the activated species F*, H* and N* adsorbed on and in the SiO$_2$ film so that these species are activated. By so doing, the thin protective film 78 is destroyed and the activated species react with SiO$_2$ (SiO$_2$ film 74), etching the SiO$_2$ film 74 as shown in FIG. 4C. On the other hand, if the time period during which the activated species are exposed with the Ar ions is within 10 seconds, a reaction with silicon does not occur and hence no etching of Si take place. In this way, the SiO$_2$ layer alone is etched without involving the etching of silicon and it is possible to obtain an infinite SiO$_2$/Si selection ratio.

The direction in which etching progresses is determined by the angle at which the inert gas's plasma or low energy ions are directed to the activated species for exposure. The exposure angle, being set in a vertical direction, that is 90°, enables anisotropic etching to be achieved. The etching, being basically a chemical reaction through the activated species, causes less injury to the silicon wafer 14 and there is no carbon contamination problem because the treating gases NF$_3$, H$_2$ and Ar contain no carbon.

Figure 5:
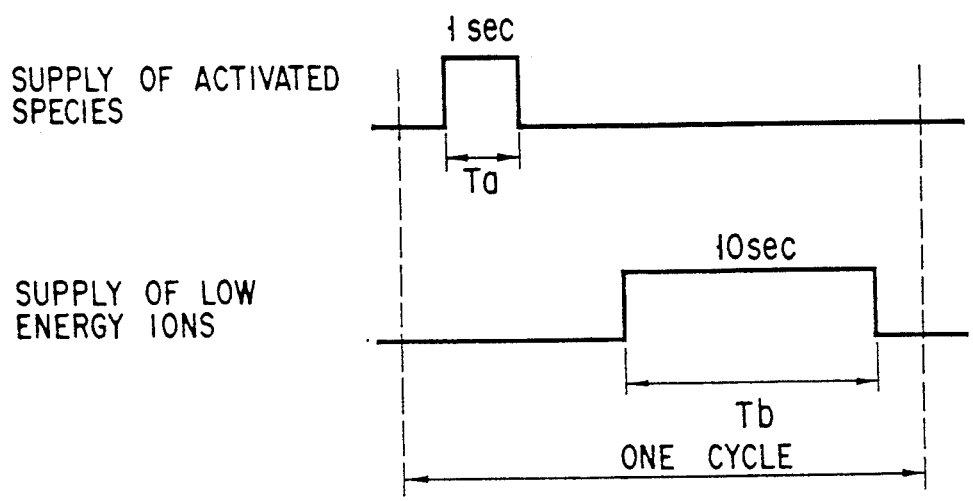
FIG. 5 is a view showing one form of timing in one cycle of a digital etching method according to the second embodiment of the present invention.

Through the repeated exposures of the inert gas's plasma or low energy ions in a given cycle it is possible to achieve so-called digital etching. FIG. 5 shows, by way of example, a one-cycle timing for the digital etching. First, the NF$_3$/H$_2$ mixture is flowed and, while applying a microwave to the mixture via the microwave guide 48 only in a given length of time Ta (for example, 1 second), induced activated species are supplied downstream. Then the flow of the mixture is stopped and the chamber 10 is evacuated. Then Ar ions of low energy are supplied to the buffer chamber for exposure. Thereafter, the chamber is again evacuated. By this one-cycle etching it is possible to etch the SiO$_2$ film by 4 to 10 angsttoms. Through the repetition of the etching cycle any desired number of times the SiO$_2$ film can be etched to a given desired depth.

Explanation will now be given below of an etching method used in conjunction with a third embodiment of the present invention. The third embodiment is similar to the second embodiment, provided that it is not the Ar ions but the low energy ions (those ions produced by converting a feed gas for an etchant which is supplied to the vacuum chamber into a plasma just over the $SiO_2$-film) which excite to activated species.

As in the case of the second embodiment, an $NF_3/H_2$ mixture is employed as a feed gas for the etchant. The $NF_3/H_2$ mixed ratio is set to be 1 : 160 in which no spontaneous etching occurs. The wafer temperature is maintained to, for example, about $-100°$ C. and an Ar gas is not used.

In the third embodiment a radio frequency RF (13.56 MHz) is supplied from the power source 68 to the susceptor 12 to create an RF electric field. The power of the power source 68 is smaller than electric power supplied to the susceptor by ordinary plasma etching and set such that ions for exciting the activated species have energy less than 20 ev.

The $HF_3/H_2$ mixture is introduced into the chamber 10 and then made into plasma by the RF electric field. In the plasma, there are activated species $F^*$, $H^*$, and $N^*$, and low energy ions $F^+$, $H^+$, and $N^+$ involved. The activated species are brought in contact with the surface of an $SiO_2$ film overlaying the wafer and some forms a very thin protective film constituted by $(NF_4)_2SiF_6$ and others stay adsorbed as they are. The low energy ions are directed to the activated species adsorbed on and in the $SiO_2$ film so that these species are activated. By so doing, the thin protective film is destroyed and the activated species etch the $SiO_2$ film.

According to this method, those ions directed vertical to the wafer accelerate the reaction of the adsorbed activated species. During etching, the direction in which the etching progresses is determined by an angle of exposure with the ions. An $(NF_4)_2SiF_6$ film, a product of reaction upon etching, is deposited on the side wall of an etched area, thus being less liable to be exposed with the ions involved. It is thus possible to achieve anisotropic etching at an exposure angle of $90°$ C., that is, in a vertical direction upon exposure.

It is possible to obtain a high selection ratio by this anisotropic etching according to the third embodiment of the present invention. Since the electric power of a high-frequency power source 68 is set to a small level so as to prevent etching from being produced under a physical action, the third etching method of the present invention is basically of a chemical reaction type to allow a reaction to progress through the activated species involved. This etching causes less damage to the silicon wafer. Further the treating gas contains no carbon, thus presenting no carbon contamination problem.

According to the present invention, as a fluorine-containing gas use can be made of $F_2$ and $SF_6$ in place of $NF_3$. It is also possible to use a mixture of $F_2$, $H_2$ and $N_2$ as a feed gas for an etchant. As an inert gas, use can be made of Kr, Ne, Xe, etc., in place of Ar. The method for producing a plasma may be of a parallel-plate, a RF, an ECR, etc., type.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for etching an $SiO_2$ film on a semiconductor wafer, comprising:
    positioning the wafer in a process chamber;
    evacuating the process chamber to a vacuum state;
    supplying activated species of fluorine and hydrogen in a mixed form onto the wafer to allow the species to be adsorbed in and on the $SiO_2$ film, a mixed ratio of the activated species being so set as not to effect etching of the $SiO_2$ film under a chemical action; and
    irradiating the adsorbed activated species with low energy ions of inert gas atoms to excite the activated species and etching the $SiO_2$ film.

2. The method according to claim 1, further comprising the step of maintaining the semiconductor wafer at a temperature less than $0°$ C. during etching.

3. The method according to claim 2, wherein the supply of the activated species and exposure of these species with the low energy ions are repeated a plurality of times.

4. The method according to claim 3, wherein the activated species of fluorine and hydrogen are generated by making a mixture of a first gas containing fluorine and second gas containing hydrogen into plasma outside the process chamber and the plasma is introduced into the process chamber so that the activated species are supplied onto the wafer.

5. The method according to claim 3, wherein activated species of nitrogen, together with the activated species of fluorine and hydrogen, are supplied onto the wafer.

6. The method according to claim 5 wherein the activated species of fluorine, hydrogen and nitrogen are generated by making a mixture of a first gas containing fluorine, second gas containing hydrogen and third gas containing nitrogen into plasma outside the process chamber and then the plasma is introduced into the process chamber so that the activated species are supplied onto the wafer.

7. The method according to claim 5, wherein the first and their gases are composed of $NF_3$ and second gas is composed of $H_2$ and an $H_2/NF_3$ mixed ratio of the mixture is above 160.

8. A method for etching an $SiO_2$ film on a semiconductor wafer, comprising the steps of:
    positioning the semiconductor wafer in a process chamber;
    evacuating the process chamber to a vacuum state;
    introducing into the process chamber a mixture of a first gas containing fluorine and second gas containing hydrogen;
    making the mixture into plasma of low energy in the process chamber;
    supplying activated species of fluorine and hydrogen in the plasma onto the wafer to allow the species to be adsorbed in and on the $SiO_2$ film, a mixed ratio in the activated species being so set as not to effect etching of the $SiO_2$ film under a chemical action;
    irradiating the adsorbed activated species with ions in the plasma to excite the activated species and etching the $SiO_2$ film.

9. The method according to claim 8, further comprising the step of maintaining the semiconductor wafer at temperature less than $0°$ C. during etching.

10. The method according to claim 9, wherein the first gas is composed of $NF_3$ and second gas is composed of $H_2$ and an $H_2/NF_3$ mixed ratio of the mixture is above 160.

11. The method according to claim 10, wherein the plasma is generated so that the ions therein have energy less than 20 ev.

* * * * *